(12) United States Patent
Makino et al.

(10) Patent No.: US 8,548,616 B2
(45) Date of Patent: Oct. 1, 2013

(54) DIGITAL AUDIO DEVICE

(75) Inventors: Takaaki Makino, Hamamarsu (JP);
Mitsutaka Gotoh, Hamamatsu (JP);
Akio Suyama, Hamamatsu (JP)

(73) Assignees: Yamaha Corporation; Morrison & Foerster LLP

( * ) Notice: Subject to any disclaimer, the term of this patent is extended or adjusted under 35 U.S.C. 154(b) by 787 days.

(21) Appl. No.: 12/748,156

(22) Filed: Mar. 26, 2010

(65) Prior Publication Data
US 2010/0249964 A1 Sep. 30, 2010

(30) Foreign Application Priority Data
Mar. 27, 2009 (JP) ................. 2009-078068

(51) Int. Cl.
*G06F 17/00* (2006.01)

(52) U.S. Cl.
USPC ............. 700/94; 381/119; 713/400; 713/500; 713/600

(58) Field of Classification Search
USPC .......................................................... 700/94
See application file for complete search history.

(56) References Cited

U.S. PATENT DOCUMENTS

| | | | |
|---|---|---|---|
| 5,266,908 A * | 11/1993 | Koulopoulos et al. ............. 331/2 |
| 5,615,189 A * | 3/1997 | Kuribayashi ................ 369/47.32 |
| 5,647,008 A * | 7/1997 | Farhangi et al. .............. 381/119 |
| 7,669,113 B1 * | 2/2010 | Moore et al. ................... 715/201 |
| 7,711,443 B1 * | 5/2010 | Sanders et al. .................. 700/94 |
| 8,341,454 B1 * | 12/2012 | Kondapalli .................... 713/600 |
| 2007/0030986 A1 | 2/2007 | McArthur et al. |
| 2007/0280490 A1 * | 12/2007 | Mizutani ........................ 381/119 |
| 2010/0128658 A1 * | 5/2010 | Bentall et al. ................. 370/316 |
| 2010/0182062 A1 * | 7/2010 | Kamath et al. ................ 327/162 |
| 2011/0002429 A1 * | 1/2011 | Williams et al. .............. 375/356 |

FOREIGN PATENT DOCUMENTS

| | | |
|---|---|---|
| JP | 07-014371 A | 1/1995 |
| JP | 09-009399 A | 1/1997 |
| JP | 90-09399 A | 1/1997 |
| JP | 10-143998 A | 5/1998 |
| JP | 2003-228918 A | 8/2003 |
| JP | 2007-116362 A | 5/2007 |

OTHER PUBLICATIONS

Apogee Big Ben clock synchronizer: copyright 2003.*
AP 2700 audio test set: copyright 2004.*
European Search Report completed Jul. 30, 2010, for EP Application No. 10156866. three pages.

* cited by examiner

*Primary Examiner* — Paul McCord
(74) *Attorney, Agent, or Firm* — Morrison & Foerster LLP

(57) ABSTRACT

A digital audio device has a plurality of input ports that are provided with a plurality of digital audio signals. A plurality of extraction parts extract a clock signal from the digital audio signal, when the clock signal is superimposed in the digital audio signal provided to corresponding input ports. A first selection part selects the extracted clock signal as a word clock when the clock signal is extracted by any one of the plurality of the extraction parts. A frequency storage part stores a frequency of the clock signal selected by the first selection part. An internal clock generator outputs a clock signal having a frequency as specified. A second selection part selects the clock signal output from the internal clock generator as a word clock when no clock signal is extracted by the plurality of the extraction parts, the frequency of the clock signal output from the internal clock generator being set to the frequency stored in the frequency storage part. A reception part receives the digital audio signals provided to the plurality of the input ports in synchronization with the word clock selected by one of the first selection part and the second selection part.

7 Claims, 6 Drawing Sheets

WC DEFAULT SETTING ROUTINE

DIGITAL AUDIO DEVICE

BACKGROUND OF THE INVENTION

1. Technical Field of the Invention

The present invention relates to a digital audio device and a method of operating the same appropriate for use in PA equipment such as an amplifier for concerts.

2. Description of the Related Art

Digitization of audio devices used for concerts or the like, which will also be referred to as PA equipment, is in progress. Specifically, a system has been commercialized, in which, although audio signals output from a mixer are output through an amplifier and a speaker, a range of components from the mixer to input terminals of the amplifier are all digital and the digital audio signals are amplified after conversion into analog signals in the amplifier, and the amplified audio signals are then emitted through the speaker. Signals input to such an amplifier that receives digital audio signals, which is referred to as a "digital amplifier", generally employ formats such as AES/EBU and ADAT. These formats enable two audio signals to be transmitted through one twisted pair cable and also enable one clock signal to be superimposed in the audio signals.

In this specification, a connector or the like corresponding to one twisted pair cable is referred to as an "input port". For example, a 3-pin XLR connector or the like is used as the input port. Accordingly, 4 input ports may be provided for an 8-channel digital amplifier. For the digital amplifier, there is a need to define a clock signal for use as a reference signal for operations of the channels. This clock signal is referred to as a "word clock". Although some digital amplifiers have a terminal dedicated to receiving the word clock, many types of digital amplifiers do not have such a dedicated terminal. For such types of digital amplifiers, there is a need to select a particular input port for receiving the word clock from among a plurality of input ports.

Japanese Patent Application Publication No. 9-9399 describes a technology for selecting an input port for receiving a word clock in PA equipment. Although Japanese Patent Application Publication No. 9-9399 directly describes a "mixer" as an embodiment, the technology described therein is also applicable to other PA equipment such as a digital amplifier. Specifically, in Japanese Patent Application Publication No. 9-9399, each input port that receives a clock signal that may be used as a word clock and each input port that receives no clock signal among a plurality of input ports provided on the mixer are displayed so as to be discriminated from each other on a display. Then, using a specific control piece or the like, the user can select one of the input ports which receive clock signals as an input port for receiving a word clock.

However, in a relatively wide concert venue (for example, a baseball field), a great number of digital amplifiers are installed at separate locations. It is very troublesome to individually set a port for receiving a word clock for each of the digital amplifiers using the technology of Japanese Patent Application Publication No. 9-9399. If a wrong word clock supply source is selected for a digital amplifier, the digital amplifier outputs no audio signal. Since analog amplifiers that receive audio signals are free from this problem, it takes a long time for users who are accustomed to working with analog amplifiers to determine the cause of the problem.

Due to these circumstances, from the viewpoint of the user, there has been demand for a digital amplifier that can be operated simply by connecting a cable for input signals to the digital mixer, similar to the analog amplifier.

SUMMARY OF THE PRESENT INVENTION

The invention has been made in view of the above circumstances and it is an object of the invention to provide a digital audio device and a method of operating the same which can eliminate the burden of the user having to set the word clock supply source.

In order to solve the above problems, there is provided a digital audio device comprising: a plurality of input ports that are provided with a plurality of digital audio signals each of which may be superimposed with a clock signal or may not be superimposed with a clock signal; a plurality of extraction parts corresponding to the plurality of the input parts, each clock signal extracting part extracting the clock signal from the digital audio signal when the clock signal is superimposed in the digital audio signal provided to the corresponding input port; a first selection part that selects the extracted clock signal as a word clock when the clock signal is extracted by any one of the plurality of the extraction parts; a frequency storage part that stores a frequency of the clock signal selected by the first selection part; an internal clock generator that outputs a clock signal having a frequency as specified; a second selection part that selects the clock signal output from the internal clock generator as a word clock when no clock signal is extracted by the plurality of the extraction parts, the frequency of the clock signal output from the internal clock generator being set to the frequency stored in the frequency storage part; and a reception part that receives the digital audio signals provided to the plurality of the input ports in synchronization with the word clock selected by one of the first selection part and the second selection part.

Preferably, the digital audio device further comprises an indicator that indicates warning when the reception part receives the digital audio signals in synchronization with the word clock selected by the second selection part.

Preferably, the digital audio device further comprises an initial setting part that is activated when the digital audio device is turned on and that enables the second selection part to select the clock signal output from the internal clock generator as the word clock regardless of whether a clock signal is extracted by the plurality of the extraction parts, the frequency of the clock signal output from the internal clock generator being set to the frequency which has been stored in the frequency storage part and which has been extracted last time.

In order to solve the above problems, there is also provided a method of operating a digital audio device including: a plurality of input ports which are provided with a plurality of digital audio signals, each of which may be superimposed with a clock signal or may not be superimposed with a clock signal; a plurality of extraction parts corresponding to the plurality of the input parts, each extraction part extracting the clock signal from the digital audio signal when the clock signal is superimposed in the digital audio signal provided to the corresponding one of the plurality of the input ports; a frequency storage part that stores a frequency; and an internal clock generator that outputs a clock signal having a frequency as specified, wherein the method performs an automatic routine comprising: a determination process of determining whether or not a clock signal is extracted by any one of the plurality of the extraction parts; a first selection process of selecting the extracted clock signal as a word clock upon determining by the determination process that the clock signal is extracted by any one of the plurality of the extraction parts; a registration process of registering a frequency of the clock signal selected by the first selection process in the frequency storage part; a second selection process of selecting the clock signal output from the internal clock generator as a word clock upon determining by the determination process that no clock signal is extracted by the plurality of the extraction parts, the frequency of the clock signal output from the internal clock generator being set to the frequency registered in the frequency storage part and a reception process of receiving the digital audio signals provided to the plurality of the input ports in synchronization with the word clock selected by one of the first selection process and the second selection process.

Preferably, the method performs the automatic routine when the digital audio device receives an instruction from an outside to set the word clock. Otherwise, the method periodically performs the automatic routine every time a predetermined time lapses. Otherwise, the method performs the automatic routine when the extraction part becomes unable to extract the clock signal which is currently selected as the word clock.

Preferably, the method performs a default routine comprising: a reading process of reading out the frequency registered in the frequency storage part when the digital audio device is turned on; a setting process of setting the frequency of the clock signal output from the internal clock generator to the frequency read out from eh frequency storage part; and a selecting process of selecting the clock signal output from the internal clock generator as the word clock regardless of whether a clock signal is extracted by the plurality of the extraction parts.

According to the invention, when a clock signal has been extracted from at least one (or any) of the plurality of extraction parts, the first selection part selects the extracted clock signal as a word clock, and, when no clock signal has been extracted from any of the plurality of extraction parts, the second selection part selects the clock signal output from the internal clock generator as a word clock while setting the frequency of the clock signal output from the internal clock generator to the frequency stored in the frequency storage part. Therefore, it is possible to automatically select an appropriate word clock supply source and thus to eliminate the burden of the user having to set the word clock.

DETAILED DESCRIPTION OF THE DRAWINGS

1. Configuration of Embodiments 1. 1. Overall Configuration

Figure 1:
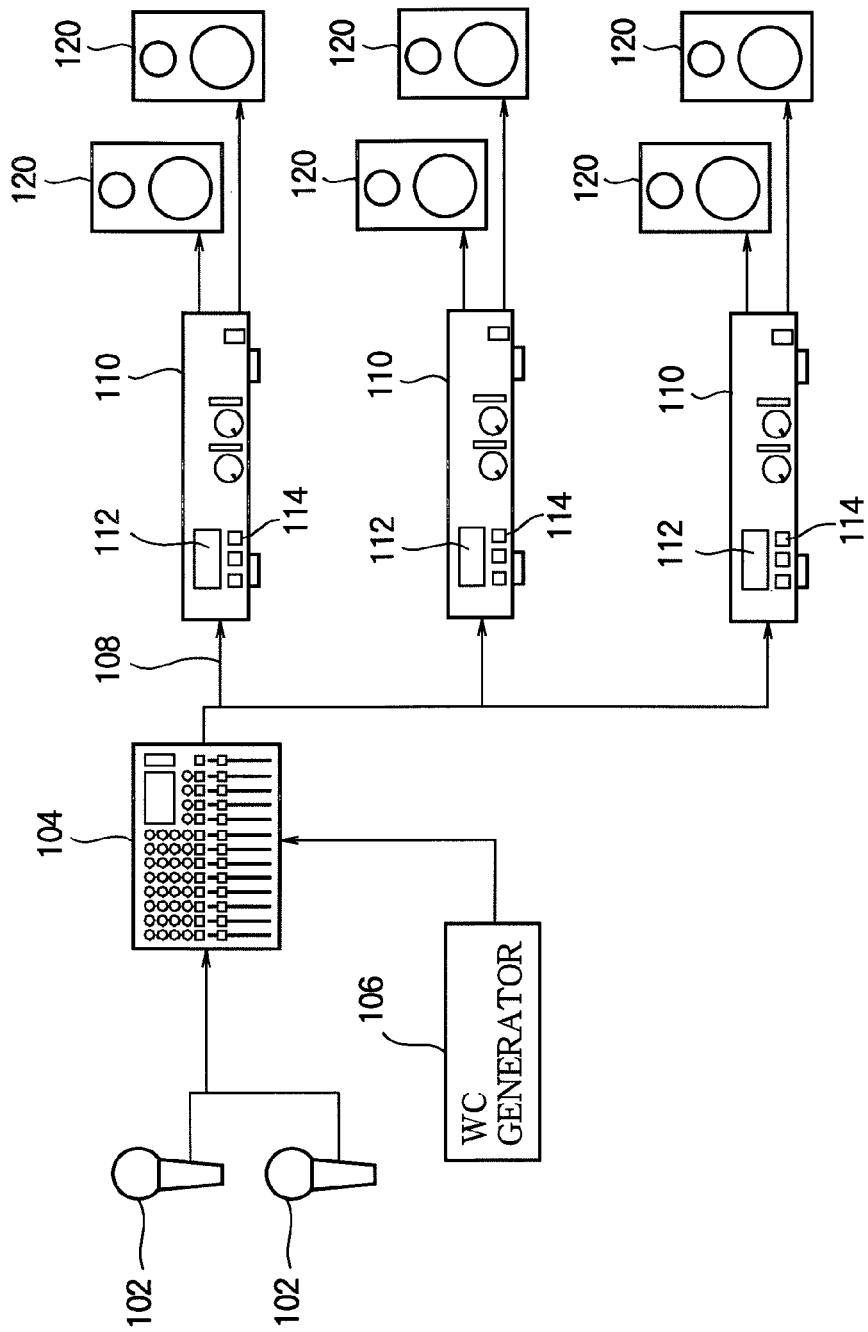
FIG. 1 is a block diagram of an audio system according to an embodiment of the invention.

A configuration of an audio system according to an embodiment of the invention is described as follows with reference to FIG. 1. In FIG. 1, reference numeral "104" denotes a digital mixer, which converts analog audio signals input from microphones 102 into digital signals and performs a mixing process on the digital signals and outputs resulting signals as digital audio signals of a plurality of channels through a communication network 108. A word clock (WC) generator 106 is connected to the digital mixer 104, which also outputs the word clock through the communication network 108.

Reference numerals 110, . . . , 110 denote a plurality of digital amplifiers, each of which receives a word clock and digital audio signals of a plurality of channels for which the digital amplifier is responsible and converts the digital audio signals into analog audio signals and amplifies the analog audio signals and then outputs the amplified audio signals through a plurality of speakers 120. A front panel of each of the digital amplifiers 110 includes a display unit 112 that displays a variety of information to the user and an operating unit 114 that includes a plurality of buttons or switches.

1. 2. Configuration of Digital Amplifier 110

Figure 2:
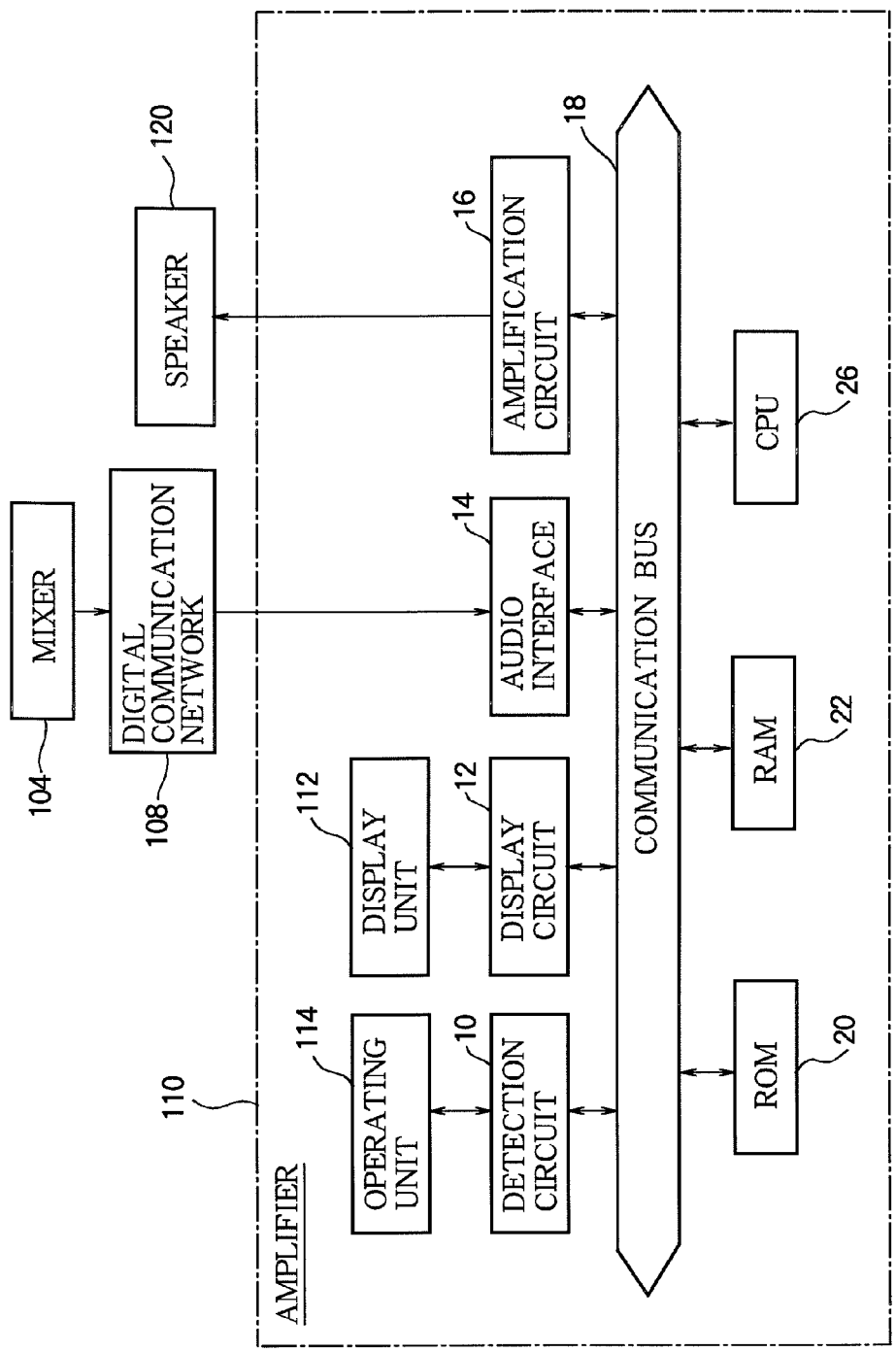
FIG. 2 is a block diagram of a digital amplifier.

Each digital amplifier 110 will now be described with reference to FIG. 2. In FIG. 2, reference numeral "26" denotes a CPU which controls other components through buses 18 based on a program described below. Reference numeral "20" denotes a ROM which stores a variety of programs or the like described below. Reference numeral "22" denotes a nonvolatile RAM which is used as a working memory of the CPU 26 and stores an operating state (specifically, the frequency of the word clock) of the digital amplifier 110. Here, the operating state of the digital amplifier 110 is maintained even when power is turned off since the RAM 22 is nonvolatile. Reference numeral "10" denotes a detection circuit which detects an operation performed on the operating unit 114 and notifies the CPU 26 of the detected operation through the buses 18.

Reference numeral "12" denotes a display circuit which causes the display unit 112 to display an image upon receiving an instruction to display the image from the CPU 26 through the buses 18. Reference numeral "14" denotes an audio interface which receives digital audio signals of a plurality of channels from the digital mixer 104 through the communication network 108 via a plurality of input ports. In a normal operating state, a word clock received via an input port is input to the audio interface 14. The audio interface 14 converts the digital audio signals into analog audio signals and outputs the analog audio signals through the buses 18. Reference numeral "16" denotes an amplification circuit which amplifies respective analog audio signals of the plurality of channels and outputs the amplified audio signals to the speakers 120.

1.3. Configuration of Audio Interface 14

Figure 3:
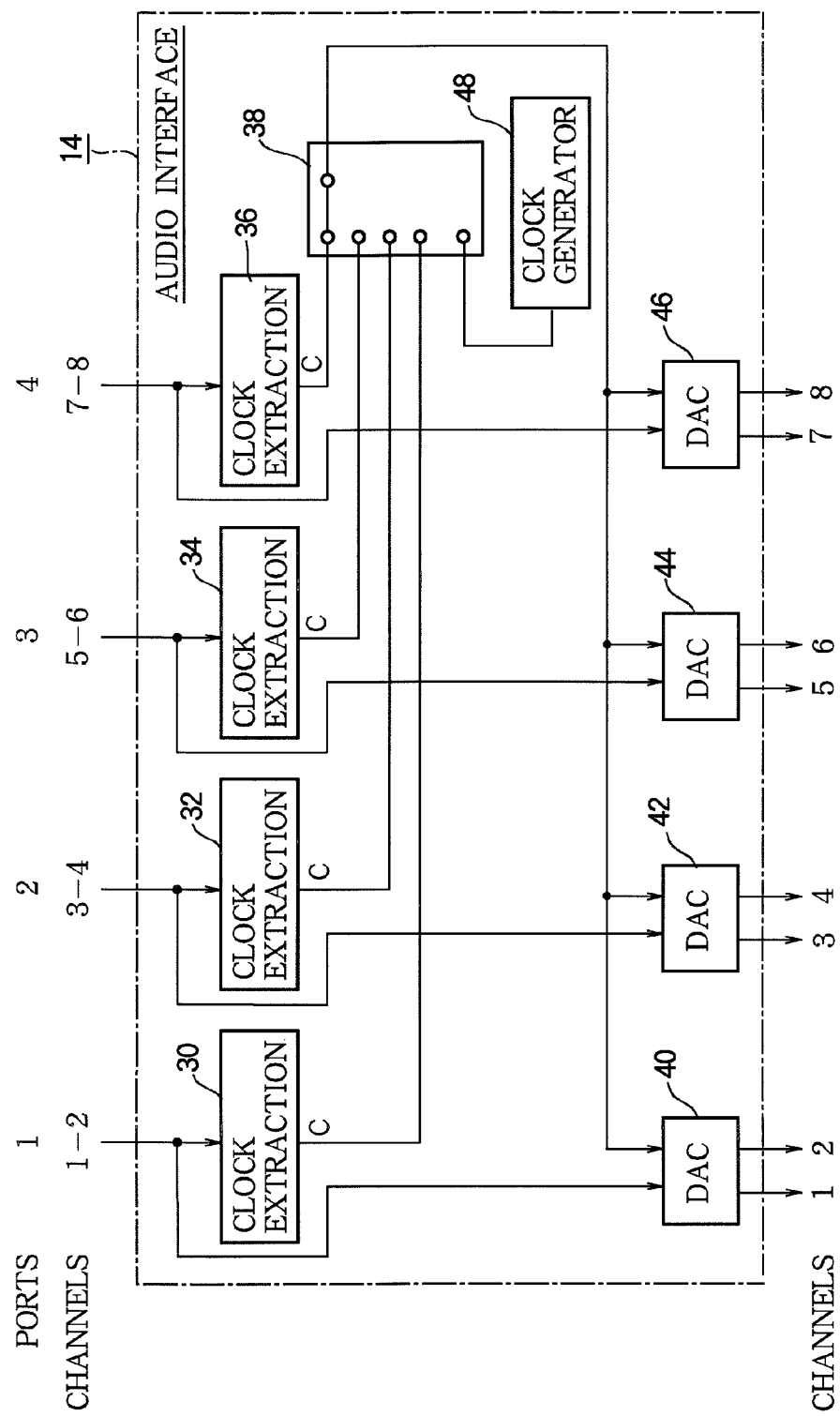
FIG. 3 is a block diagram of an audio interface in the digital amplifier.

A detailed configuration of the audio interface 14 will now be described with reference to FIG. 3.

First to fourth input ports are provided on the audio interface 14. Digital audio signals of a pair of first and second input channels, a pair of third and fourth input channels, a pair of fifth and sixth input channels, and a pair of seventh and eighth input channels are input to the audio interface 14 through the four input ports, respectively. Reference numerals 30, 32, 34, and 36 denote clock extraction circuits which extract clock signals from the signals input through the input ports and provide the extracted clock signals to a clock selection switch 38. Specifically, each of the clock extraction circuits 30, 32, 34, and 36 includes a PLL circuit which is locked by a clock signal received from the corresponding input port and outputs the clock signal. A clock signal to which the PLL circuit can be locked is one of clock signals of "44.1 kHz", "48 kHz", "88.2 kHz", and "96 kHz". It is not possible to extract a clock signal from an input signal received at an input port when no clock signal has been superimposed in the input signal. Whether or not each of the clock extraction circuits 30, 32, 34, and 36 is in a locked state and the locked clock signal frequency are reported to the CPU 26 through the buses 18.

Reference numeral "48" denotes an internal clock generator which outputs a clock signal having a frequency that the CPU 26 specifies from among "44.1 kHz", "48 kHz", "88.2 kHz", and "96 kHz". The clock selection switch 38 selects a clock signal as a word clock, which will be provided for actual use, from among clock signals provided from the internal clock generator 48 and the clock extraction circuits 30, 32, 34, and 36 based on an instruction from the CPU 26. Reference numerals 40, 42, 44, and 46 denote DA converters which convert digital audio signals input from the first to fourth input ports into analog audio signals of the first to eighth input channels in synchronization with the selected word clock and output the analog audio signals through the buses 18.

1. 4. User Interface

Figure 4:
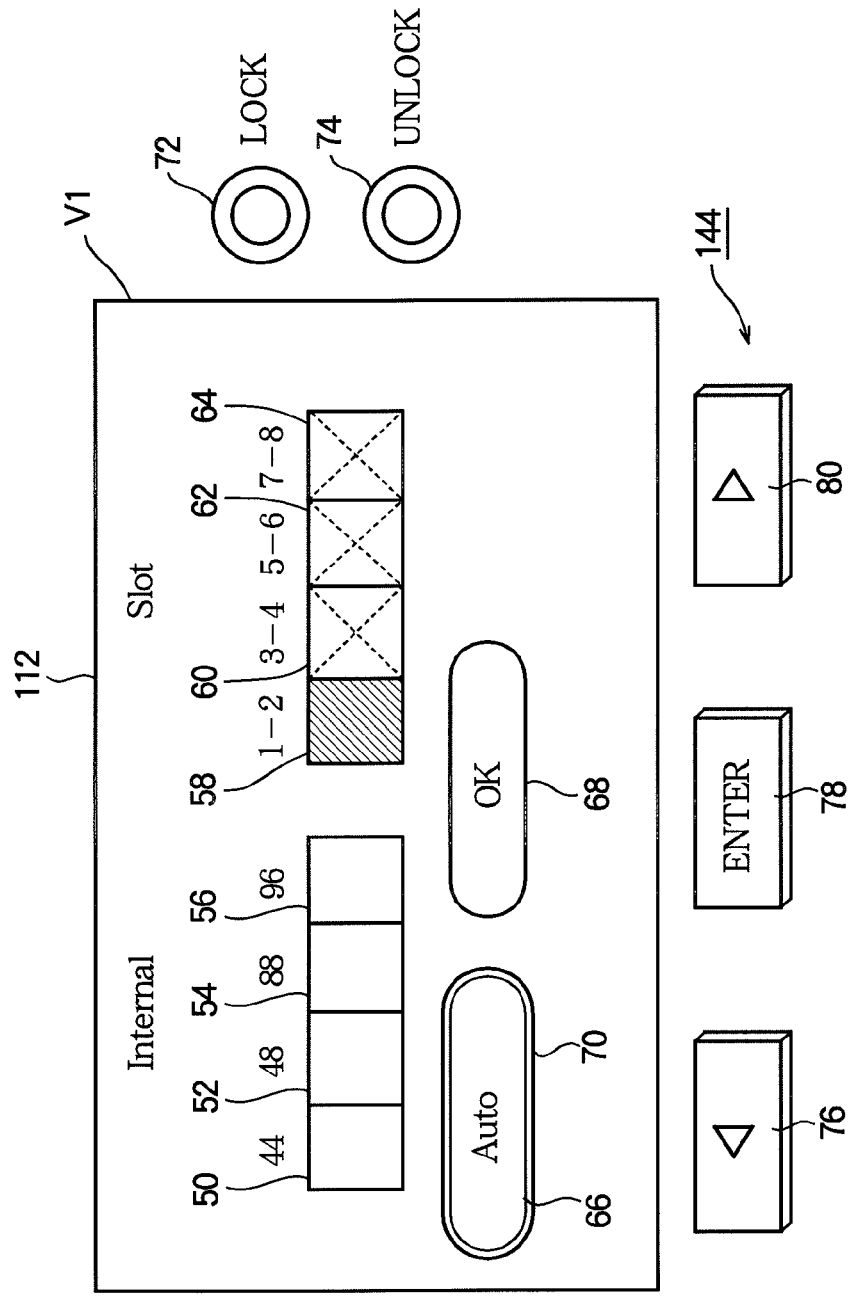
FIG. 4 is a front view of main components of the digital amplifier.

Details of a user interface of the digital amplifier 110 will now be described with reference to FIG. 4.

The operating unit 114 includes an enter button 78 and left and right navigation buttons 76 and 80. When a user has performed a specific operation on these buttons, a word clock setting window V1 is displayed on the display unit 112 as shown in FIG. 4. Reference numerals 50, 52, 54, and 56 denote clock selectors for internal clocks which correspond respectively to the "44.1 kHz", "48 kHz", "88.2 kHz", or "96 kHz" generated by the internal clock generator 48. Reference numerals 58, 60, 62, and 64 denote clock selectors for input ports which correspond respectively to the first to fourth input ports.

States of corresponding clock signals are displayed on the clock selectors 50 to 64. That is, among the clock selectors 50 to 64 shown in FIG. 4, each "blank" selector currently indicates that the corresponding internal clock signal (actually, the internal clock generator 48 generating the clock signal) has not been selected as a word clock master (i.e., as a word clock supply source) although it can be selected as the word clock master. In addition, each selector with mark "x" affixed thereto indicates that the corresponding input port cannot be selected as a word clock master (for example, that no clock signal has been received through the input port). A hatched selector indicates that the corresponding input port can be selected as a word clock master and currently selected as a word clock master. Accordingly, in the example of FIG. 4, it can be seen that the first input port is selected as a word clock master and the other input ports, i.e., the second to fourth input ports cannot be selected as a word clock master. It can also be seen that a clock signal output by the internal clock generator 48 can be selected as a word clock master as needed although it is not currently selected as a word clock master.

Reference numeral "66" denotes an auto button which is used to instruct resetting of a word clock master which will be described in detail later. Reference numeral "68" denotes an OK button which is used to instruct closing of the word clock setting window V1. Reference numeral "70" denotes a cursor which moves within the word clock setting window V1 each time the user presses a navigation button 76 or 80. The cursor 70 is movable within a range including selectable clock selectors (i.e., blank or hatched selectors) among the clock selectors 50 to 64, the auto button 66, and the OK button 68. If the enter button 78 is pressed with the cursor 70 being placed on one of the clock selectors 50 to 64, the corresponding clock selector is uniquely selected as a word clock master.

Figure 5:
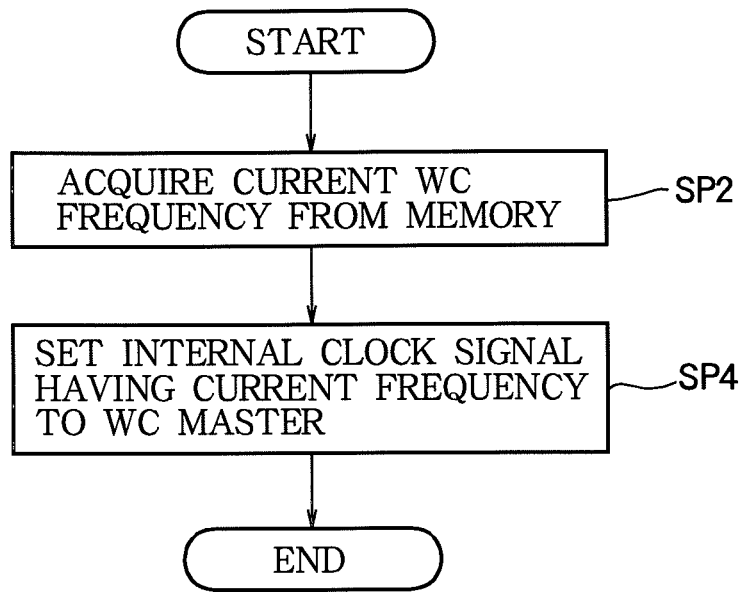
FIGS. 5(a) to 5(c) are flow charts of a control program of the digital amplifier.
Figure 5:
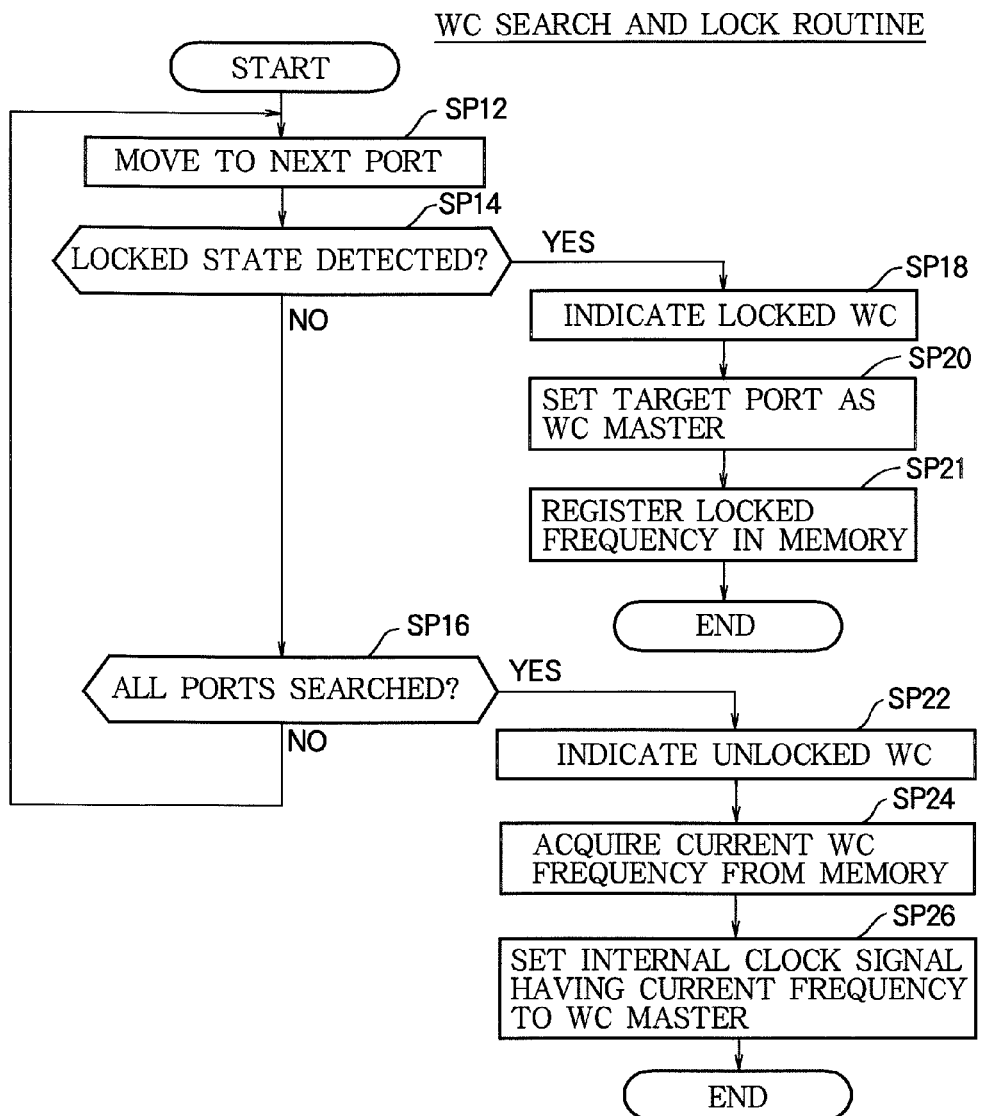
Figure 5:
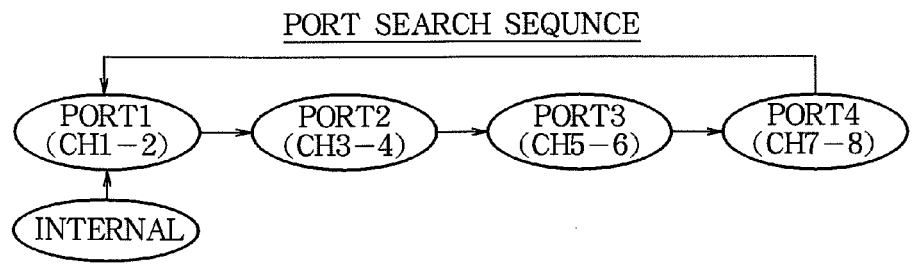

On the other hand, if the enter button 78 is pressed with the cursor 70 being placed on the OK button 68, the word clock setting window V1 is closed and a basic or main window (not shown) of the digital amplifier 110 is displayed on the display unit 112. If the enter button 78 is pressed with the cursor 70 being placed on the auto button 66, a WC search/lock routine (automatic routine), which is described later with reference to FIG. 5(b), is activated. Reference numeral "72" located to the right of the display unit 112 denotes a (green) lock indicating lamp which is an indicator lit when one of the first to fourth input ports has been selected as a word clock master. Reference numeral "74" denotes a (red) unlock warning lamp which is an indicator lit when the internal clock generator 48 has been selected as a word clock master.

In this embodiment, the clock signal output from the internal clock generator 48 is not synchronized with a digital audio signal input from each port. Therefore, when the internal clock signal has been selected as a word clock, each of the DA converters 40 to 46 does not necessarily latch each bit of the digital audio signal with appropriate timing, which may cause noise. Therefore, the unlock warning lamp 74 indicates warning when the internal clock generator 48 has been selected as a word clock master.

2. Operations of Embodiment 2. 1. Initial Operations

Operations of this embodiment will now be described.

First, when power is supplied to the digital amplifier 110 to turn on, a WC default setting routine shown in FIG. 5(a) is activated. First, when a procedure shown in FIG. 5(a) proceeds to step SP2, a current frequency CUR_WC is read from a predetermined address of the RAM 22. The current frequency CUR_WC is the frequency of a clock signal that is selected as a word clock last time from among clock signals that the digital amplifier 110 has received through input ports. Then, when the procedure proceeds to step SP4, the current frequency CUR_WC is set as an output frequency of the internal clock generator 48 and the clock selection switch 38 selects the internal clock generator 48 as a word clock master. When these steps are completed, the initial default routine is terminated.

2. 2. WC Search and Lock Operation

In this embodiment, a WC search/lock routine shown in FIG. 5(b) is activated in any of the following cases.

(1) When the enter button 78 is pressed with the cursor 70 (see FIG. 4) being placed on the auto button 66. Namely, the inventive method performs the automatic routine when the digital audio device receives an instruction from an outside to set the word clock.

(2) At intervals of a predetermined time (for example, about 10 seconds) in the case where the internal clock generator 48 has been selected as a word clock master. Namely, the inventive method periodically performs the automatic routine every time a predetermined time lapses.

(3) When one of the clock extraction circuits 30, 32, 34, and 36 corresponding to an input port that has been selected as a word clock master is released from the locked state. Namely, the inventive method performs the automatic routine when the extraction part becomes unable to extract the clock signal which is currently selected as the word clock.

When this automatic routine is called, the procedure shown in FIG. 5(b) proceeds to step SP12. At step SP12, a next input port is selected as an inspection target port according to a search sequence shown in FIG. 5(c) based on the current word clock master. For example, if the current word clock master is the internal clock generator 48, the first input port is selected as an inspection target port and, if the current word clock master is the third input port, the fourth input port is selected as an inspection target port.

Then, the procedure proceeds to step SP14 at which it is determined whether or not one of the clock extraction circuits 30, 32, 34, and 36 corresponding to the inspection target port is in a locked state. Here, if it is determined that the clock extraction circuit corresponding to the inspection target port is in a locked state (i.e., YES at step SP14), the procedure proceeds to step SP18 at which the lock indicating lamp 72 is lit and the unlock warning lamp 74 is extinguished. Then, the procedure proceeds to step SP20 at which the clock selection switch 38 selects the clock extraction circuit as a word clock master. Then, the procedure proceeds to step SP21 at which the frequency of the word clock is stored as a current frequency CUR_WC in the RAM 22 and the procedure of this routine is then terminated.

On the other hand, if it is determined at SP14 that the clock extraction circuit corresponding to the inspection target port is not in a locked state (i.e., NO at step SP14), the procedure proceeds to step SP16. At step SP16, it is determined whether or not all the first to fourth input ports have been selected as inspection target ports. Here, if it is determined that not all four input ports have been selected as inspection target ports (i.e., NO at step SP16), the procedure returns to step SP12 at which a next input port is selected as an inspection target port according to the search sequence of FIG. 5(c) and the subsequent steps, starting from step SP14, are performed in the same manner as described above. Then, if it is determined at step SP16 that all the four input ports have been selected as inspection target ports (i.e., YES at step SP16), the procedure proceeds to step SP22.

At step SP22, the lock indicating lamp 72 is extinguished and the unlock warning lamp 74 is lit since none of the clock extraction circuits 30, 32, 34, and 36 has been detected as being in a locked state in this case. Namely, none of the clock extraction circuits 30, 32, 34 and 36 extracts the clock signal from the input audio signal. The procedure then proceeds to step SP24 at which the current frequency CUR_WC is read from the RAM 22. Then, at step SP26, the current frequency CUR_WC is set as an output frequency of the internal clock generator 48 and the clock selection switch 38 selects the internal clock generator 48 as a word clock master. When these steps are completed, the procedure of this routine is terminated.

3. Advantages of Embodiment

In this embodiment, when power is supplied to the digital amplifier 110, the current frequency CUR_WC is selected as the output frequency of the internal clock generator 48 and the internal clock generator 48 is initially and temporarily selected as a word clock master (SP2 and SP4) as described above. Since a single user (typically, a PA engineer) generally has a strong tendency to continuously use a specific frequency as the word clock frequency, the current frequency CUR_WC automatically selected when power is supplied to the digital amplifier 110 is also likely to be an appropriate frequency for the current purpose.

Thereafter, the WC search/lock routine shown in FIG. 5(b) is activated at intervals of a predetermined time. Therefore, when a clock signal is provided from an input port, this provision is detected (SP14) and the input port is automatically selected as a word clock master (SP18 to SP21). Accordingly, even when the user does not perform any operation, it is possible to automatically achieve synchronization between input digital audio signals and the word clock.

In addition, when an input port has been selected as a word clock master, one of the clock extraction circuits 30, 32, 34, and 36 corresponding to the input port is released from the locked state if no clock signal is provided from the input port due to an accident or the like. In this embodiment, the WC search/lock routine shown in FIG. 5(b) is automatically activated in this case such that another input port which is receiving a clock signal is searched for (SP12 to SP16) and the found input port is selected as a new word clock master (SP18 to SP21). Accordingly, a clock signal synchronized with input digital audio signals can be continuously selected as a word clock.

Further, in this embodiment, the WC search/lock routine shown in FIG. 5(b) can also be activated when the user presses the enter button 78 with the cursor 70 (see FIG. 4) being placed on the auto button 66. Accordingly, by performing this operation, the user can immediately reset the word clock master without waiting for a predetermined time (for example, 10 seconds) if the user thinks that the resetting is needed.

The invention is also characterized by the operations performed when a locked clock signal has not been detected at any input port (i.e., YES at step SP16). That is, in this case, the internal clock generator 48 can be set as a word clock master while the current frequency CUR_WC, which is the frequency of a clock signal that is selected last time as a word clock among clock signals received from input ports, is determined to be the output frequency of the internal clock generator 48 (steps SP22 to SP26). Accordingly, even when no clock signal is provided from all input ports, it is possible to continuously perform DA conversion using the current frequency CUR_WC which is equal to a previous clock frequency and to continuously output analog audio signals (although noise may occur as described above).

4. Modifications

The invention is not limited to the above embodiments and can provide, for example, a variety of modifications as follows.

(1) Although the above processes including the process for selecting a word clock master are performed using the program running on the CPU 26 in the above embodiments, it is also possible to store and distribute the program on a recording medium such as a CD-ROM or a memory card or to distribute the program through a communication line.

(2) Although the above embodiments have been described with reference to examples in which the invention is applied to the digital amplifier 110, the invention is not limited to application to the digital amplifier 110 and is also applicable to a variety of digital audio devices such as a mixer or a switcher.

The invention is characterized by the following configurations. Here, elements in parentheses are references for illustrative purposes. A digital audio device according to the invention includes a plurality of input ports, to each of which a digital audio signal is respectively provided while a clock signal is superimposed in the digital audio signal as needed, a plurality of extraction parts (30-36), each of which extracts, when a clock signal is superimposed in a digital audio signal provided to a corresponding one of the plurality of input ports, the clock signal from the digital audio signal, a first selection part (38, SP18-SP21) that selects, when a clock signal has been extracted by at least one of the plurality of extraction parts (30-36), the extracted clock signal as a word clock, a frequency storage part (22, CUR_WC) that stores a frequency of the clock signal selected by the first selection part (38, SP18-SP21), an internal clock generator (48) that outputs a clock signal having a specified frequency, a second selection part (38, SP22-SP26) that selects, when no clock signal has been extracted by the plurality of extraction parts (30-36), the clock signal output from the internal clock generator (48) as a word clock while setting the frequency of the clock signal output from the internal clock generator (48) to the frequency stored in the frequency storage part (22, CUR_WC), and a reception part (40-46) that receives digital audio signals provided to the plurality of input ports in synchronization with the selected word clock.

A program according to the invention is applied to a digital audio device. The digital audio device includes a plurality of input ports, to each of which a digital audio signal is respectively provided while a clock signal is superimposed in the digital audio signal as needed, a plurality of extraction parts (30-36), each of which extracts, when a clock signal is superimposed in a digital audio signal provided to a corresponding one of the plurality of input ports, the clock signal from the digital audio signal, a frequency storage part (22, CUR_WC) that stores a value of frequency, an internal clock generator (48) that outputs a clock signal having a specified frequency, a clock selection part (38) that selects, as a word clock, one of clock signals output from the plurality of extraction parts (30-36) and the internal clock generator (48), a reception part (40-46) that receives digital audio signals provided to the plurality of input ports in synchronization with the selected word clock, and a processing unit (26). The program causes the processing unit (26) to perform a determination process (SP12, SP14, SP16) of determining whether or not a clock signal has been extracted by at least one of the plurality of extraction parts (30-36), a first selection process (SP18, SP20) of causing the clock selection part (38) to select, when it is determined that a clock signal has been extracted by at least one of the plurality of extraction parts (30-36), the extracted clock signal as the word clock, a storage process (SP21) of causing the frequency storage part (22, CUR_WC) to store or register a frequency of the clock signal selected in the first selection process (SP18-SP21), and a second selection process (SP22-SP26) of causing the clock selection part (38) to select, when it is determined in the determination process (SP12, SP14, SP16) that no clock signal has been extracted by the plurality of extraction parts (30-36), the clock signal output from the internal clock generator (48) as the word clock while setting the frequency of the clock signal output from the internal clock generator (48) to the frequency registered in the frequency storage part (22, CUR_WC).

The invention claimed is:

1. A digital audio device comprising:
a plurality of input ports that are adapted to receive digital audio signals;
a plurality of extraction parts corresponding to the plurality of the input ports, each extraction part extracting a clock signal from the digital audio signal when a clock signal is superimposed in the digital audio signal received by the corresponding input port;
a first selection part that selects the extracted clock signal as a word clock when the clock signal is extracted by one of the plurality of the extraction parts;
a frequency storage part that stores a frequency of the clock signal selected by the first selection part as a current frequency;
an internal clock generator that outputs a clock signal having a frequency as specified;
a second selection part that determines whether another extraction part extracts a clock signal when the one extraction part becomes unable to extract the clock signal which is currently selected as the word clock, and that selects the clock signal output from the internal clock generator as a word clock when it is determined that no clock signal is extracted by any of the plurality of the extraction parts and sets the frequency of the clock signal output from the internal clock generator to the current frequency stored in the frequency storage part; and
a reception part that receives the digital audio signals provided to the plurality of the input ports in synchronization with the word clock selected by one of the first selection part and the second selection part.

2. The digital audio device according to claim 1, further comprising an indicator that indicates warning when the reception part receives the digital audio signals in synchronization with the word clock selected by the second selection part.

3. The digital audio device according to claim 1, further comprising an initial setting part that is activated when the digital audio device is turned on and that enables the second selection part to select the clock signal output from the internal clock generator as the word clock regardless of whether a clock signal is extracted by the extraction parts, the frequency of the clock signal output from the internal clock generator being set to the frequency which has been stored in the frequency storage part and which has been extracted last time.

4. A method of operating a digital audio device including: a plurality of input ports which receive digital audio signals; a plurality of extraction parts corresponding to the plurality of the input ports, each extraction part extracting a clock signal from the digital audio signal when a clock signal is superimposed in the digital audio signal received by the corresponding one of the plurality of the input ports; a frequency storage part that stores a frequency; and an internal clock generator that outputs a clock signal having a frequency as specified; the method performing an automatic routine comprising:
a determination process of determining whether or not a clock signal is extracted by one of the plurality of the extraction parts;
a first selection process of selecting the extracted clock signal as a word clock upon determining by the determination process that the clock signal is extracted by any one of the plurality of the extraction parts;
a registration process of registering a frequency of the clock signal selected by the first selection process to the frequency storage part as a current frequency;
another determination process of determining whether another extraction part extracts a clock signal when the one extraction part becomes unable to extract the clock signal which is currently selected as the word clock;
a second selection process of selecting the clock signal output from the internal clock generator as a word clock upon determining by the determination process that no clock signal is extracted by any of the plurality of the extraction parts, and setting the frequency of the clock signal output from the internal clock generator to the current frequency registered in the frequency storage part; and
a reception process of receiving the digital audio signals provided to the plurality of the input ports in synchronization with the word clock selected by one of the first selection process and the second selection process.

5. The method according to claim 4, performing the automatic routine when the digital audio device receives an instruction from an outside to set the word clock.

6. The method according to claim 4, periodically performing the automatic routine every time a predetermined time lapses.

7. The method according to claim 4, performing a default routine comprising:
- a reading process of reading out the frequency registered in the frequency storage part when the digital audio device is turned on;
- a setting process of setting the frequency of the clock signal output from the internal clock generator to the frequency read out from the frequency storage part; and
- a selecting process of selecting the clock signal output from the internal clock generator as the word clock regardless of whether a clock signal is extracted by the plurality of the extraction parts.

* * * * *